United States Patent [19]

Saigoh

[11] Patent Number: 5,387,811
[45] Date of Patent: Feb. 7, 1995

[54] COMPOSITE SEMICONDUCTOR DEVICE WITH A PARTICULAR BIPOLAR STRUCTURE

[75] Inventor: Satoshi Saigoh, Tokyo, Japan

[73] Assignee: NEC Corporation, Japan

[21] Appl. No.: 103,323

[22] Filed: Aug. 3, 1993

Related U.S. Application Data

[63] Continuation of Ser. No. 823,686, Jan. 22, 1992, abandoned.

[30] Foreign Application Priority Data

Jan. 25, 1991 [JP] Japan .................. 3-023883

[51] Int. Cl.[6] .............. H01L 29/73; H01L 29/804; H01L 29/40
[52] U.S. Cl. .................. 257/378; 257/577; 257/370; 257/588
[58] Field of Search ............ 357/43, 23.4, 67.5; 257/370, 576, 588, 575, 378, 577, 566, 587, 588

[56] References Cited

U.S. PATENT DOCUMENTS

| | | | |
|---|---|---|---|
| 4,714,951 | 12/1987 | Baudrant et al. | 357/67.5 |
| 4,954,865 | 9/1990 | Rokos | 257/588 |
| 5,059,549 | 10/1991 | Furuhata | 357/43 |
| 5,101,257 | 3/1992 | Hayden et al. | 257/587 |
| 5,119,162 | 6/1992 | Todd et al. | 257/370 |

Primary Examiner—Rolf Hille
Assistant Examiner—Wael M. Fahmy
Attorney, Agent, or Firm—Laff, Whitesel, Conte & Saret, Ltd.

[57] ABSTRACT

Disclosed is an improved bipolar-and-complementary MOS transistor coexisting semiconductor device and a method of making the same. A collector-and-base separator is formed on the site allotted to a bipolar transistor along with a source-and-drain separator on each site allotted to PMOS and NMOS transistors. The superficial collector-and-base separator coating causes no stress to the lattice of the underlying region in the epitaxy of the semiconductor substrate, and therefore there can be no lattice defect which may appear in a conventional composite type semiconductor device structure as a result of selective oxidization of the epitaxial layer to separate the base and collector region of the bipolar transistor. Such a superficial collector-and-base separator according to the present invention assures that the bipolar transistor each of such composite type semiconductor devices is free from the lowering of the breakdown voltage at its collector-and-base junction.

2 Claims, 8 Drawing Sheets

FIG. IA
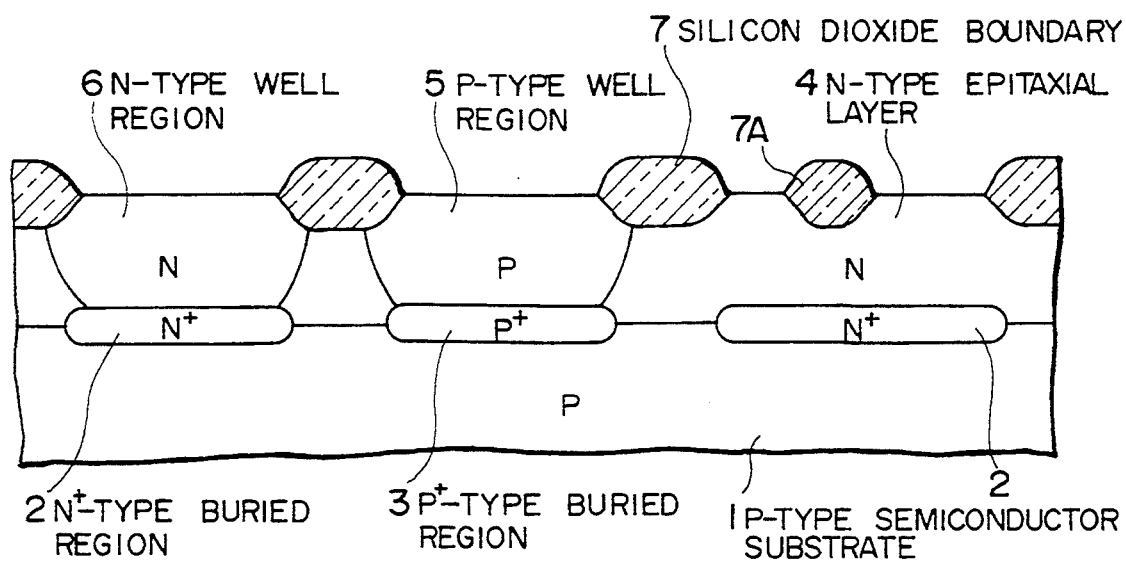
FIG. IB
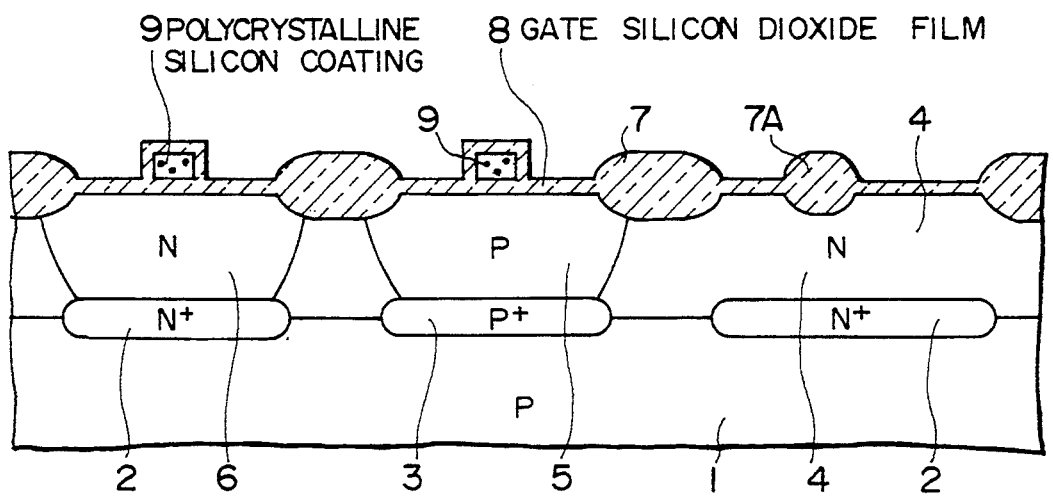

COMPOSITE SEMICONDUCTOR DEVICE WITH A PARTICULAR BIPOLAR STRUCTURE

This application is a continuation of application Ser. No. 07/823,686, filed Jan. 22, 1992 abandoned.

BACKGROUND OF THE INVENTION

1. Field of the Invention

The present invention relates to a semiconductor device, and more particularly to a composite semiconductor device having at least one semiconductor device such as a MOS transistor and at least one bipolar transistor both built therein, and a method of making the same.

2. Description of the Prior Art

A composite semiconductor device having two complementary MOS transistors and one bipolar transistor formed on its semiconductor substrate is well known. As a matter of fact, the majority (55%) of such composite type semiconductor device products are rejected because of defective bipolar transistors formed therein. Specifically, bipolar transistors when built in composite semiconductor devices are liable to have insufficient resistance to counter voltage when applied between the heavily doped collector and base regions of the bipolar transistor. This is a significant cause for reduction of output or yield rate.

FIGS. 1A to 1F show how such a composite semiconductor device is produced. Referring to FIG. 1A, a semifabricated product is prepared. It comprises a P-type semiconductor substrate 1 having an N-type epitaxial layer 4 formed on its surface, two adjacent buried regions 2 and 3 heavily doped with P- or N-type impurity in the boundary between the P-type semiconductor substrate 1 and the N-type epitaxial layer 4, N-type and P-type well regions 6 and 5 extending upward from buriedregions 2 and 3 in the N-type epitaxial layer 4, anotherburied region 2 heavily doped with N-type impurity in the boundarybetween the P-type semiconductor substrate land the N-type epitaxial layer 4, and silicon dioxide boundaries 7 on the N-type epitaxial layer 4 to define first areas lying on the well regions 5 and 6 allotted to two complementary MOS transistors to be formed and a second area lying above the buried region 2 allotted to a bipolar transistor to be formed. In the second area the first and second subareas, in which the collector and the base regions of the bipolar transistor are to be formed, are separated and defined by silicon dioxide boundary 7A.

Referring to FIG. 1B, a gate silicon dioxide film 8 is formed on the surface of the epitaxial layer 4. Then, a polycrystalline silicon coating which is 4,000 to 6,000 angstroms thick, is formed on the insulating film 8. The polycrystalline silicon coating thus formed is selectively removed by etching to leave a piece of polycrystalline silicon coating 9 on each of the first areas in which a PMOS device and an NMOS device are to be formed. These pieces of polycrystalline silicon coating 9 are covered by an insulating film of silicon dioxide.

Referring to FIG. 1C, photoresist coating 11A is applied to the adjacent first areas and the first subarea of the second area, and then the second subarea of the second area is injected with a P-type impurity such as boron in the form of ions, thus forming a P-type base region 12.

Referring to FIG. 1D, another photoresist coating 11b is applied to one of the adjacent first area and the second subarea of the second area, exposing the other first area in which an NMOS transistor is to be formed and the first subarea of the second area in which the collector of the bipolar transistor is to be formed. Then, the exposed areas are subjected to ion-injection of an N-type impurity such as arsenic to form N+-type source and drain regions 13 in the other first area which is allotted to the NMOS device, and N+-type collector region 14 in the second area which is allotted to the bipolar transistor.

Referring to FIG. 1E, still another photoresist coating 11c is applied to the other first area and the first subarea and the proximal part of the second subarea of the second area, exposing the one first area in which the PMOS transistor is to be formed and the distal part of the second subarea of the second area in which the graft base region of the bipolar transistor is to be formed. Then, the exposed area are subjected to ion-injection of a P-type impurity such as boron to form P+-type source and drain regions 15 of the PMOS device and P+-type graft base region 16 of the bipolar transistor.

Referring to FIG. 1F, a silicon dioxide film 17 is formed on the whole surface of the semiconductor substrate, and holes are made in the part of the insulating film 17 under which part there lie the part of the subsecond area to be allotted to the emitter of the bipolar transistor. The hole is filled with polycrystalline silicon as indicated at 18. An N+-emitter region 19 is formed by ion injecting the emitter-allotted part of the subsecond area with an N-type impurity such as arsenic. Finally, a PSG film 20 is formed on the whole surface of the substrate, and holes are made to reach the respective regions 12 to 16, and aluminum electrodes 21 are inserted in these holes.

As described earlier, the N+-type-collector region 14 and the P+-type-base region 12 of the bipolar transistor are separated by silicon dioxide boundary 7A, thus preventing the lowering of the resistance to counter voltage at the collector-and-base junction the bipolar transistor. With this arrangement the lateral dimension of the silicon dioxide boundary 7A determines the space between the P-type base region 12 and the N type collector region 14 of the bipolar transistor.

In the course of selective oxidization of the epitaxial layer 4 to form silicon dioxide boundary 7A, a certain stress due to such selective oxidization is most likely to appear in the collector-and-base junction to cause a lattice defect, which is a cause for lowering the breakdown voltage at the junction. This will lead to substantial reduction of the output rate of composite semiconductor devices.

SUMMARY OF THE INVENTION

It is therefore an object of the present invention to provide an improved bipolar-and-complementary MOS transistor coexisting type composite semiconductor device structure which is guaranteed free of lowering the breakdown voltage at the collector-andemitter junction of the bipolar transistor.

It is another object of the present invention to provide a method of such improved bipolar-and-complementary MOS transistor coexisting type composite semiconductor devices.

To attain these objects a bipolar-and-complementary MOS transistor coexisting type composite semiconductor device uses a piece of polycrystalline silicon coating on the epitaxial layer between the collector region and the base region of the bipolar transistor in place of a silicon dioxide boundary, which is used to separate the collector region and the base region of the bipolar transistor in the conventional composite semiconductor device structure. The superficial collector-and-base separator coating causes no stress to the lattice of the underlying region in the epitaxy of the semiconductor substrate, and therefore there can be no lattice defect which may appear in the conventional composite type semiconductor device structure as a result of selective oxidization of the epitaxial layer. Such superficial collector-and-base separators according to the present invention assures that the bipolar transistor each of such composite type semiconductor devices is free from the lowering of the breakdown voltage at its collector-and-base junction.

Other objects and advantages of the present invention will be understood from the following description of preferred embodiments of the present invention.

BRIEF DESCRIPTION OF THE DRAWINGS

FIGS. 1A to 1F show the sequential steps of a conventional method of producing a bipolar-and-complementary MOS transistor coexisting semiconductor device;

DETAILED DESCRIPTION OF THE PREFERRED EMBODIMENTS

Figure 1C:
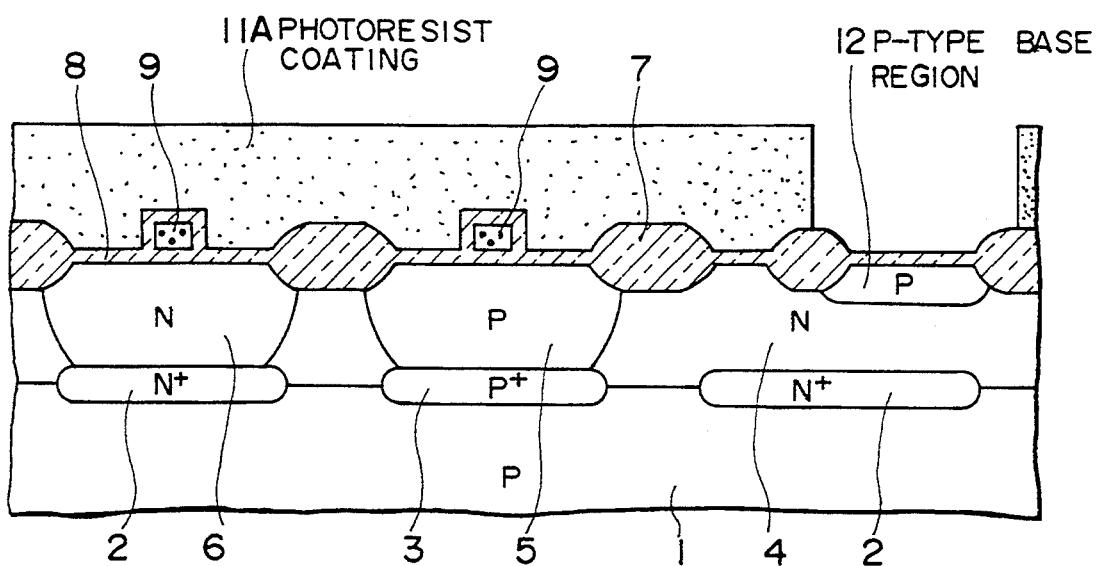
Figure 1D:
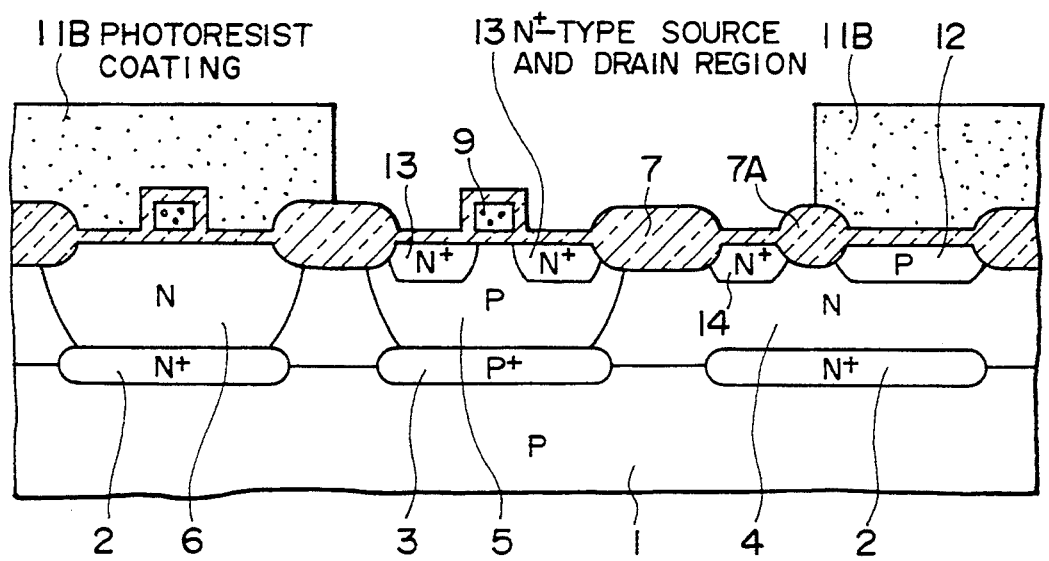
Figure 1E:
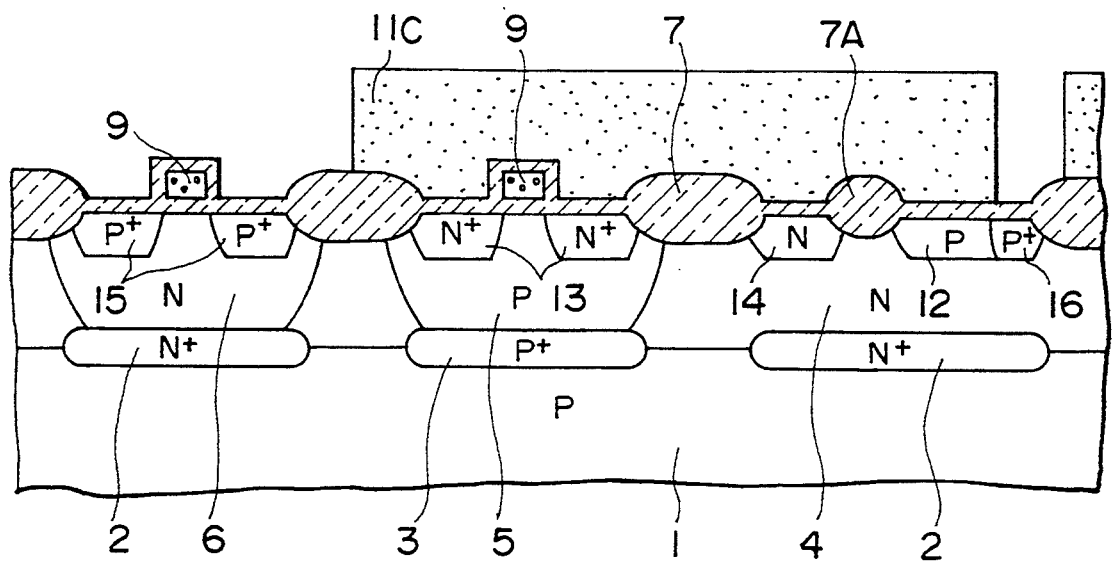
Figure 1F:
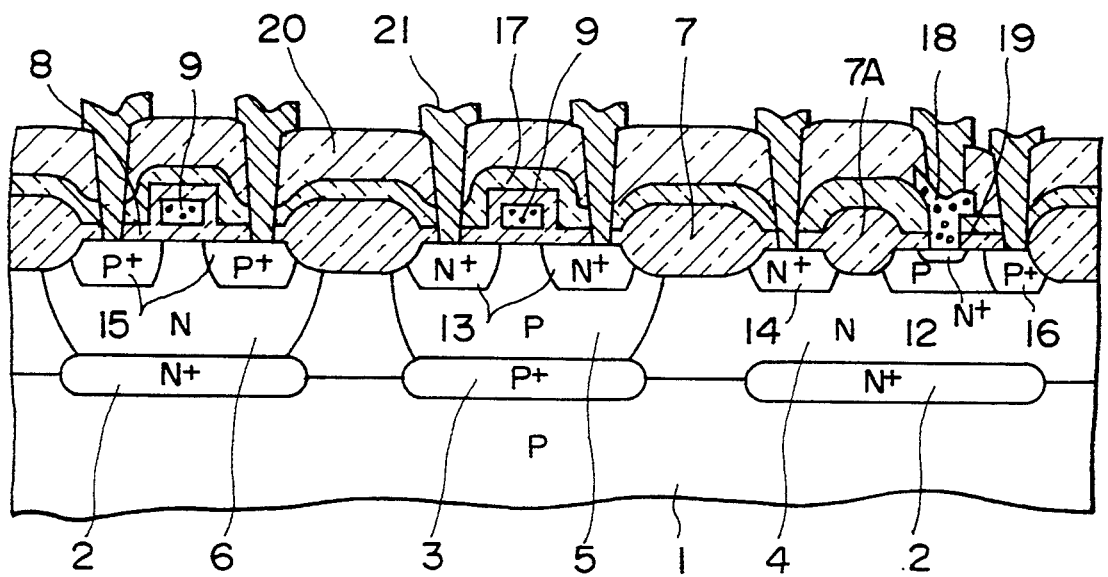
Figure 2A:
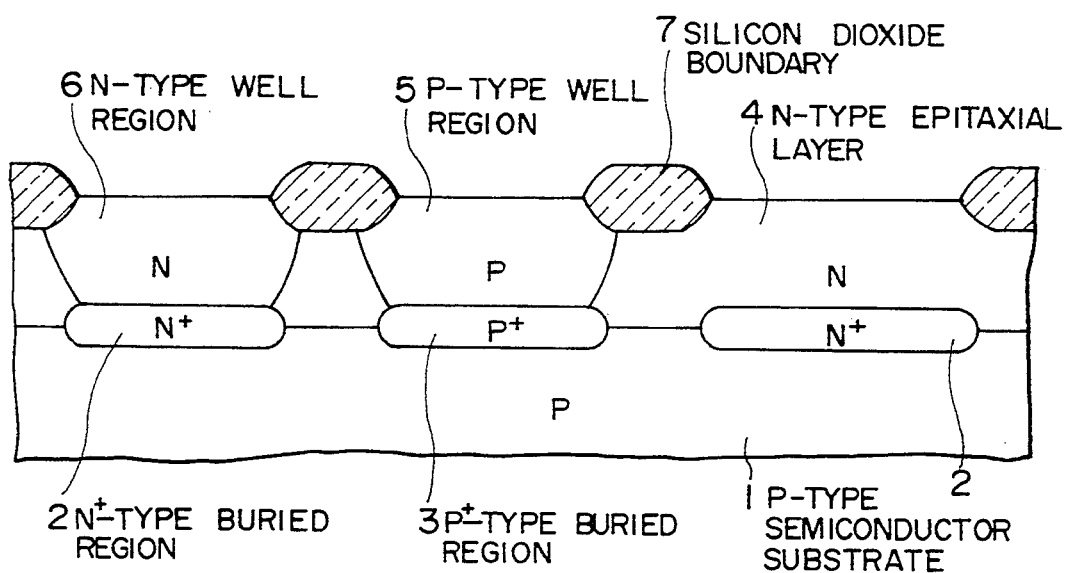
FIGS. 2A to 2F show the sequential steps of a method of producing a bipolar-and-complementary MOS transistor coexisting semiconductor device according to one preferred embodiment of the present invention.

Referring to FIG. 2A, a semi-fabricated product is prepared as is the case with FIG. 1A. Specifically, an N-type epitaxial layer 4 is formed on a P-type semiconductor substrate 1. As shown, buried regions 2 and 3 are formed by heavily doping two selected epitaxy-and-substrate boundary areas (hereinafter referred to as "leading first buried region 2" and "following first buried region 3") with N- and P-type impurities, and N-type and P-type well regions 6 and 5 are formed on the leading first buried region 2 and the following first buried region 3 in the epitaxial layer 4. Another N-type buried region 2 is formed by heavily doping a selected epitaxy-and-substrate boundary areas (hereinafter referred to as "second buried region 2") with impurity. 5,000 to 150,000 angstrom-thick N-type silicon dioxide 7 is formed on the epitaxial layer 4 to define leading and following first areas and a second area lying above the leading first buried region 2 and following first buried region 3 and the second buried region 2 respectively. The leading and following first areas are allotted to P-type and N-type MOS transistors to be formed whereas the second area is allotted to a bipolar transistor to be formed.

Figure 2B:
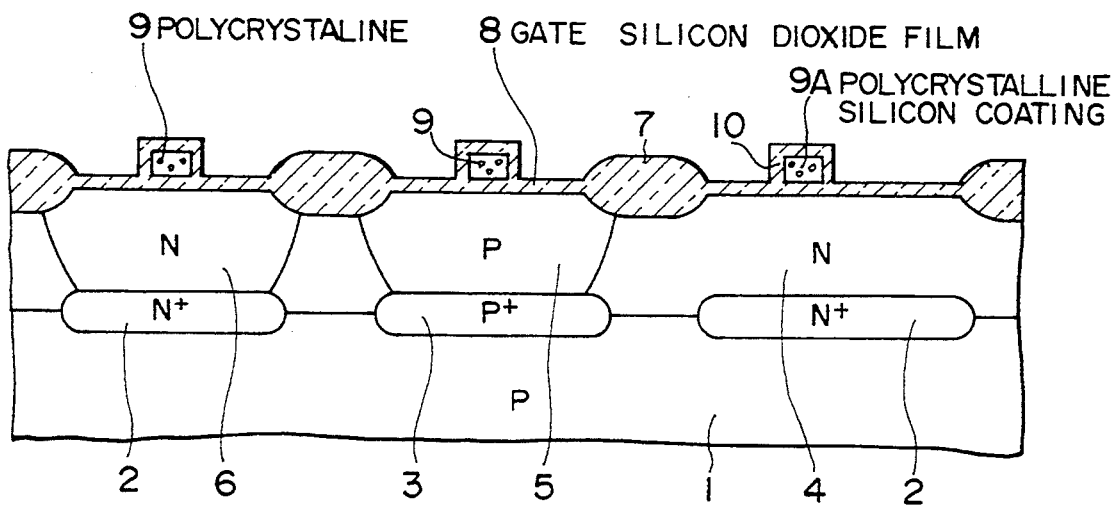

Referring to FIG. 2B, a 100 to 1,000 angstrom thick gate silicon dioxide film 8 is formed on the overall surface of the epitaxial layer 4, and then a 4,000 to 6,000 angstrom thick polycrystal line silicon coating is applied on the insulating film 8. The polycrystalline silicon coating thus formed is selectively removed to leave a piece of polycrystalline silicon coating 9 on each of the leading and following first areas, and a 0.5 to 10 micron wide piece of polycrystalline silicon coating 9A on the second area, which piece of polycrystalline silicon coating 9A can function to separate the base and collector regions of a bipolar transistor to be formed in place of the silicon dioxide boundary 7A in FIGS. 1A to 1F. The remaining pieces of polycrystalline silicon coating 9 and 9A are oxidized to provide silicon dioxide coating 10 on each piece.

Figure 2C:
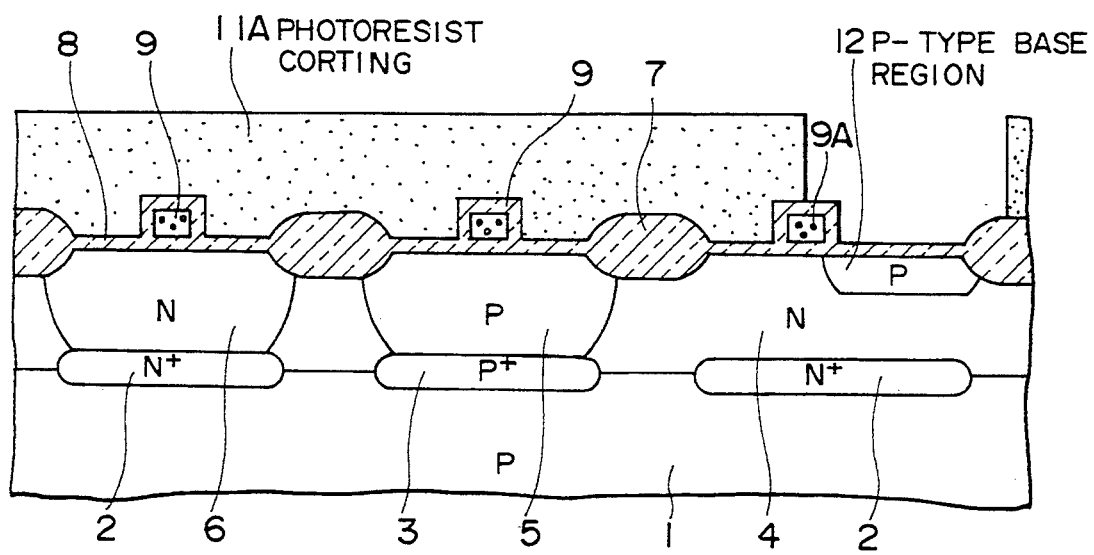

Referring to FIG. 2C, a photoresist coating 11A is applied to the insulating film 8 and the pieces of polycrystalline silicon coating 9 on the leading and following first areas and the piece of polycrystalline silicon coating 9A on the second area to cover the first areas and one half of the second area, leaving the other half of the second area exposed on the side remote from the following first area. The exposed second half area which is delimited by the collector-and-base separator 9A and the silicon dioxide boundary 7, is injected with P-type impurity to form a P-type base region 12 of the bipolar transistor.

Figure 2D:
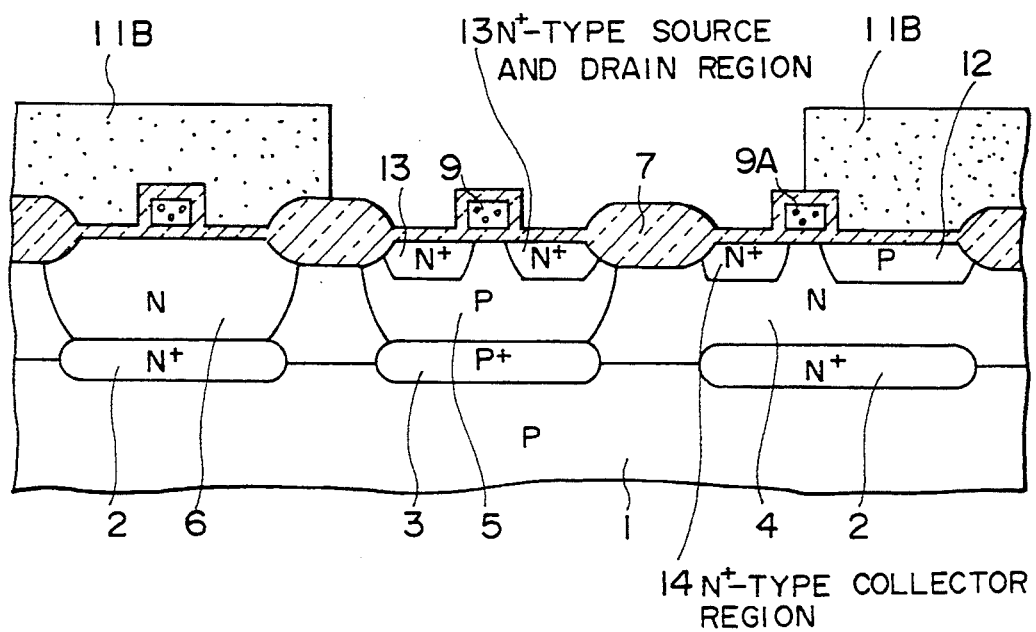

Referring to FIG. 2D, another photoresist coating 11B is applied to the other half of the second area to leave the following first area and one half of the second area exposed on the side close to the following first area, and the exposed area thus defined is injected with an N-type impurity such as arsenic to form the source and drain regions 13 of the NMOS transistor and the collector region 14 of the bipolar transistor respectively. The collector-and-base distance of the bipolar transistor is determined by the width of the piece of polycrystalline silicon coating 9A.

Figure 2E:
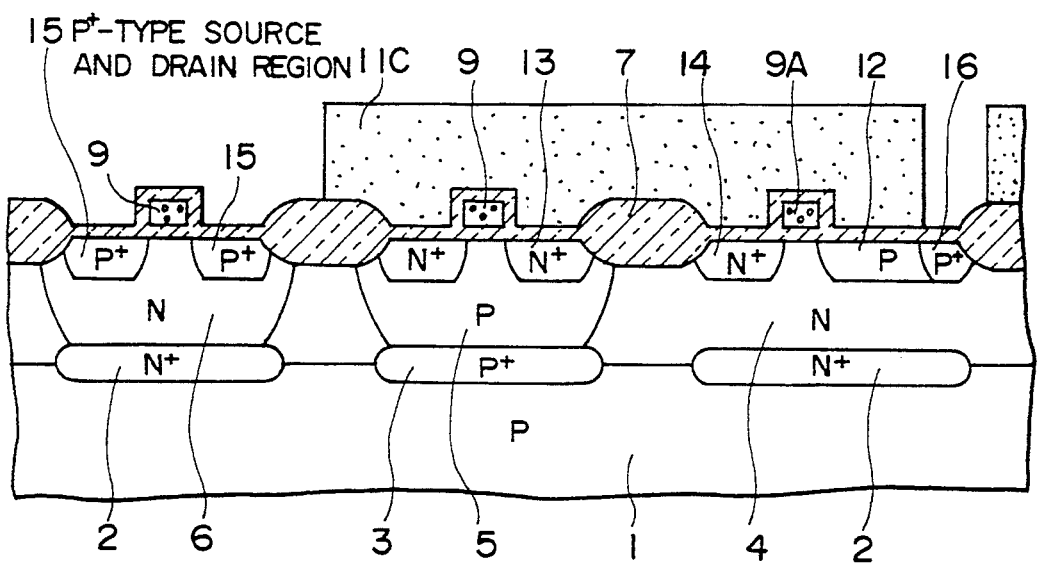

Referring to FIG. 2E, still another photoresistcoating 11C is applied to the following first area and the substantial part of the second area to leave the leading first area and the remaining small part of the second area on the side remote from the collector 14, and the exposed areas thus defined are injected with a P-type impurity such as boron to form the source and drain regions 15 of the PMOS transistor and the graft base region 16 of the bipolar transistor.

Figure 2F:
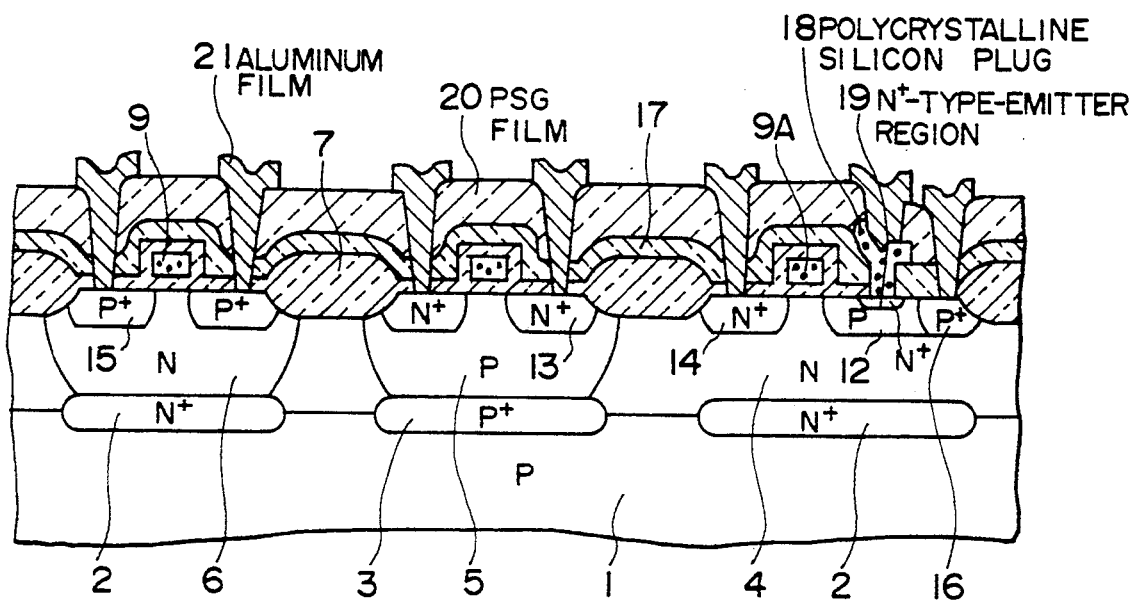

Referring to FIG. 2F, a silicon dioxide film 17 is formed on the overall surface of the semiconductor substrate, and a hole is made to reach the underlying base region 12. The hole is filled with polycrystalline silicon 18, and an N-type impurity such as arsenic is ion-injected into the underlying base region 12 via the polycrystalline silicon plug 18 to form the emitter region 19. Finally a PSG film 20 is formed over the whole surface of the semiconductor substrate 1, and holes are made at selected places. Aluminum electrodes 21 are inserted in these holes.

Figure 3A:
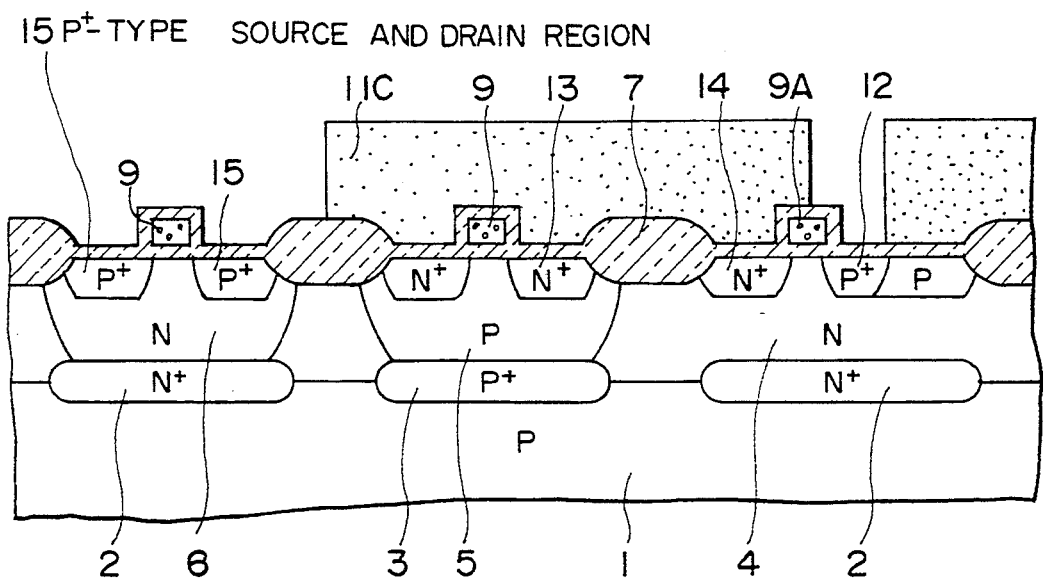
FIGS. 3A to 3C show selected sequential steps to a method of producing a bipolar-and-complementary MOS transistor coexisting semiconductor device according to another preferred embodiment of the present invention.
Figure 3B:
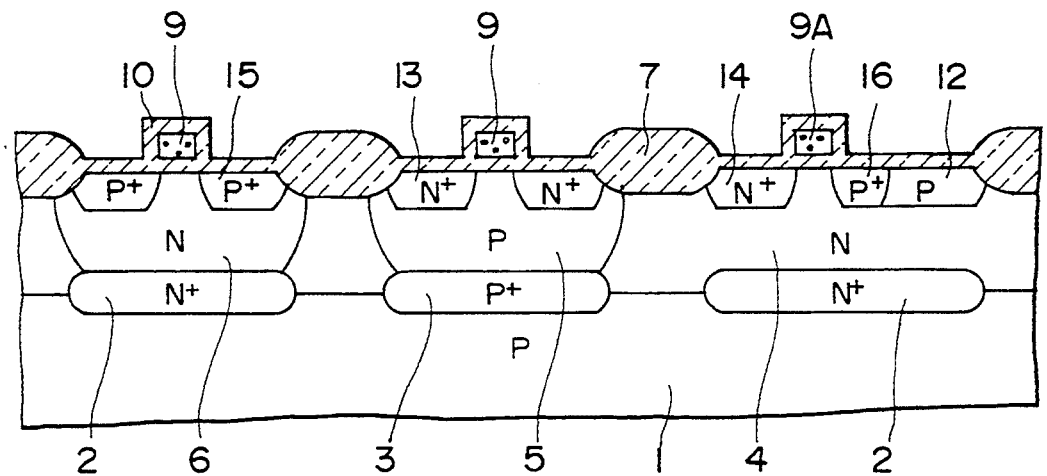
Figure 3C:
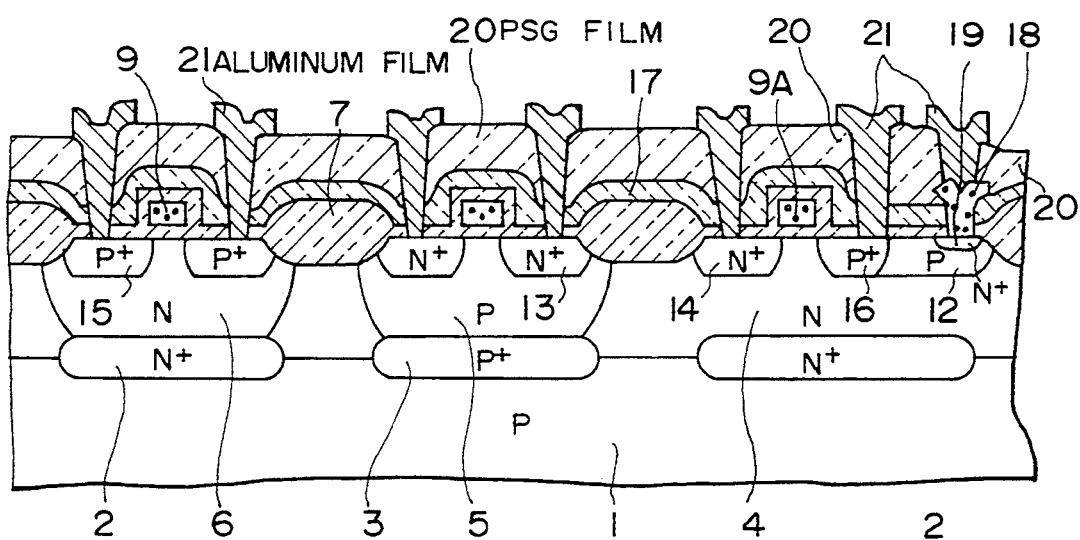

FIGS. 3A to 3C show how a bipolar-and-complementary MOS transistor coexisting semiconductor device according to another preferred embodiment of the present invention is made. This composite type semiconductor device is different from the one of FIG. 2F only that the graft base 16 is positioned to be close to the collector of the bipolar transistor. FIG. 3A corresponds to FIG. 2E, and as seen from FIG. 3A, a photoresist coating 11C is applied to the following first area and the substantial part of the second area to leave the leading first area and the remaining small part of the second area lying behind the collector-and-base separator 9A on the side close to the collector 14, and the exposed areas thus defined are injected with a P-type impurity such as boron to form the source and drain regions 15 of the PMOS transistor and the graft base region 16 of the bipolar transistor, as seen from FIG. 3B.

Referring to FIG. 3C, a bipolar-and-complementary MOS transistor coexisting semiconductor device is provided by forming final insulating coatings and attaching aluminum electrodes 21. It is different from the composite semiconductor device structure of FIG. 2F only in that the graft base 16 is positioned to be close to the collector 14 of the bipolar transistor.

As may be understood from the above, a collector-and-base separator 9A is formed on the second area allotted to a bipolar transistor along with a source-and-drain separator 9 on each of the first area allotted to PMOS and NMOS transistors. The simultaneous coating of collector-and-base separator 9A and source-and-drain separators 9 is advantageous for time-saving, and what is most important is: the superficial collectorr-and-base separator coating causes no stress to the lattice of the underlying region in the epitaxial layer 4, and therefore there can be no lattice defect which may appear in the conventional composite type semiconductor device structure as a result of selective oxidization of the epitaxial layer to form silicon dioxide boundary 7A. In fact, use of such superficial collector-and-base separators according to the present invention assures that the bipolar transistor each of such composite type semiconductor devices is free from the lowering of the breakdown voltage at its collector-and-base junction. In fact, the yield rate is raised from about 45% to 60%.

In an attempt to lower the resistance of transistor electrodes and increase the operating speed a high-melting point metal may be coated on polycrystalline silicon coating. Collector-and-base separator 9A may be of tungsten, molybdenum, tantalum etc.

What is claimed is:

1. A composite semiconductor device comprising a semiconductor substrate having first and second portions provided apart from each other; a bipolar transistor formed on said first portion of said semiconductor substrate; and an insulated gate field effect transistor formed on said second portion of said semiconductor substrate; said bipolar transistor including a collector region, an insulating film covering said collector region, a polycrystalline silicon film selectively formed on said insulating film and having first and second side edges to define a width of said polycrystalline silicon film, a base region selectively formed in said collector region and having a side periphery which is substantially aligned with said first side edge of said polycrystalline silicon film, and a collector contact region formed in said collector region and having a side periphery which is substantially aligned with said second side edge of said polycrystalline silicon film, a distance between said side periphery of said base region and said side periphery of said collector contact region being substantially equal to said width of said polycrystalline silicon film; and said insulated gate field effect transistor including a well region, source and drain regions selectively formed in said well region to define a channel region, a gate insulating film covering said channel region, and a gate electrode formed on said gate insulating film.

2. A composite semiconductor device having a bipolar transistor and a field effect transistor, said bipolar transistor comprising a collector region, a field insulating film partially embedded in said collector region to define a surface portion in said collector region, an insulator film formed on said surface portion of said collector region, a polycrystalline silicon film selectively formed on said insulator film and having first and second side edges to define a width of said polycrystalline silicon film, a base region selectively formed in said surface portion of said collector region and having a first side periphery which is in contact with a part of said field insulating film and a second side periphery which is substantially aligned with said first side edge of said polycrystalline silicon film, and a collector contact region selectively formed in said surface portion of said collector region and having a third side periphery which is in contact with another part of said field insulating film and a fourth side periphery which is substantially aligned with said second side edge of said polycrystalline silicon film, a distance between said second side periphery of said base region and said fourth side periphery of said collector contact region being substantially equal to said width of said polycrystalline silicon film.

* * * * *